United States Patent
Hamberger et al.

(10) Patent No.: US 10,895,610 B2
(45) Date of Patent: Jan. 19, 2021

(54) MEASURING ARRANGEMENT FOR DETECTING A MAGNETIC UNIDIRECTIONAL FLUX IN THE CORE OF A TRANSFORMER

(71) Applicant: Siemens Aktiengesellschaft, Munich (DE)

(72) Inventors: Peter Hamberger, Kirchschlag bei Linz (AT); Gerald Leber, Grosspesendorf (AT); Helfried Passath, Unterfladnitz (AT); Helmut Pregartner, Krottendorf (AT); Alfons-Karl Schrammel, Waldbach (AT)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 15/312,536

(22) PCT Filed: May 7, 2015

(86) PCT No.: PCT/EP2015/060020
§ 371 (c)(1),
(2) Date: Nov. 18, 2016

(87) PCT Pub. No.: WO2015/185316
PCT Pub. Date: Dec. 10, 2015

(65) Prior Publication Data
US 2017/0089986 A1    Mar. 30, 2017

(30) Foreign Application Priority Data
Jun. 6, 2014  (EP) .................................. 14171500

(51) Int. Cl.
*G01R 33/00*  (2006.01)
*G01R 33/04*  (2006.01)
(Continued)

(52) U.S. Cl.
CPC ......... *G01R 33/0017* (2013.01); *G01R 33/04* (2013.01); *H01F 27/08* (2013.01);
(Continued)

(58) Field of Classification Search
CPC ..... G01R 33/0017; G01R 33/04; H01F 27/08; H01F 2029/143; H01F 27/33;
(Continued)

(56) References Cited

U.S. PATENT DOCUMENTS 3,863,109 A   1/1975  Emanuel et al.
5,847,910 A   12/1998 Efantis et al.
(Continued)

FOREIGN PATENT DOCUMENTS

CA    2800551     10/2011
CN    101681716    3/2010
(Continued)

OTHER PUBLICATIONS

Office Action dated Oct. 10, 2017 which issued in the corresponding Canadian Patent Application No. 2,951,066.

*Primary Examiner* — Jay Patidar
(74) *Attorney, Agent, or Firm* — Cozen O'Connor

(57) ABSTRACT

Measuring arrangement for detecting a magnetic unidirectional flux in the core of a transformer, wherein a sensor, formed from a ferromagnetic sensor core which is surrounded by a sensor coil, is arranged in a section of a core limb in a cooking channel, where the section is predefined by the width of the winding, or is arranged in an annular space, formed from an outer peripheral surface of the core limb and an inner peripheral surface of an associated transformer winding, such that a magnetic partial flux is diverted by the core limb and guided over at least one non-ferromagnetic gap.

5 Claims, 6 Drawing Sheets

(51) Int. Cl.
  *H01F 27/08*  (2006.01)
  *H01F 27/42*  (2006.01)
  *H01F 27/38*  (2006.01)
  *H01F 30/12*  (2006.01)

(52) U.S. Cl.
  CPC .......... *H01F 27/085* (2013.01); *H01F 27/38* (2013.01); *H01F 27/42* (2013.01); *H01F 30/12* (2013.01)

(58) Field of Classification Search
  CPC .......... H01F 27/38; H01F 27/42; H01F 27/34; H01F 27/28; H01F 27/385; H01F 27/345; H01F 27/085; H01F 30/12
  See application file for complete search history.

(56) References Cited

U.S. PATENT DOCUMENTS

| | | |
|---|---|---|
| 7,196,514 B2 | 3/2007 | Li |
| 2010/0194373 A1 | 8/2010 | Hamberger et al. |
| 2013/0049751 A1* | 2/2013 | Hamberger ........ G01R 33/0023 324/253 |
| 2017/0089986 A1 | 3/2017 | Hamberger et al. |

FOREIGN PATENT DOCUMENTS

| | | |
|---|---|---|
| EP | 2952997 | 2/2017 |
| JP | 02-163666 | 6/1990 |
| WO | WO 2008/151661 | 12/2008 |
| WO | WO 2011/127969 | 10/2011 |
| WO | WO 2015/185316 | 12/2015 |

\* cited by examiner a)

b)

c)

d)

a)

b) Section A-A a)

b)

a)

b)

MEASURING ARRANGEMENT FOR DETECTING A MAGNETIC UNIDIRECTIONAL FLUX IN THE CORE OF A TRANSFORMER

CROSS-REFERENCE TO RELATED APPLICATIONS

This is a U.S. national stage of application No. PCT/EP2015/060020 filed 7 May 2015. Priority is claimed on European Application No. 14171500.3 filed 6 Jun. 2014, the content of which is incorporated herein by reference in its entirety.

BACKGROUND OF THE INVENTION

1. Field of the Invention

The invention relates to a measuring arrangement for detecting a magnetic unidirectional flux in the core of a transformer, a compensating device and a method for compensation.

2. Description of the Related Art

In electrical transformers, such as those used in energy distribution networks, a magnetic unidirectional flux can develop in the core of the transformer. This magnetic unidirectional flux may be caused by a direct-current component (d.c. component) that is used by power-electronic components, such as in connection with electric drives or reactive power compensation systems. Although normally amounting to just a few parts per thousand of the nominal transformer current, this d.c. component causes a distortion of the magnetizing current, which is then no longer sinusoidal. The temperature in the magnetic core therefore increases, as does the temperature of the winding. A further unwanted effect is increased noise emission, which is considered disruptive if the transformer is installed in the vicinity of a residential area in particular. Other causes of magnetic unidirectional flux are however also known, e.g., "geomagnetically induced currents" (GIC).

In order to reduce the unwanted magnetic unidirectional flux in a transformer, use is customarily made of compensating devices. These compensating devices are controlled in accordance with a characteristic variable that represents the magnetic unidirectional flux.

For the purpose of determining such a characteristic variable, WO 2011/127969 proposes a magnetic shunt part, this being enwound by a sensor coil and arranged at the yoke of the transformer or in a limb region that is not covered by the winding.

There are also design formats of transformers in which the flux distribution at the yoke or at a freely accessible point on the core limb is unfavorable as a measurement location due to the complex flux distribution that is present at this location and which changes according to the saturation state. This applies in the case of transformers in a power range upwards of approximately 50 MVA, where the transformers are usually formed as five-limb core transformers (i.e., 3/2 cores).

In the case of a five-limb core transformer, the detection of a magnetic unidirectional flux via the aforementioned shunt parts may be disrupted by stray flux, and therefore greater expense is required for the magnetic screening of the stray flux and/or for the electronic evaluation of the sensor signal.

SUMMARY OF THE INVENTION

The object of the present invention is to provide a measuring arrangement and method by which a characteristic variable corresponding to a magnetic unidirectional flux can be determined largely without interference and effectively compensated by a compensating device in an extremely simple manner, even in the case of high-power transformers.

This and other objects and advantages are achieved in accordance with the invention by a measuring arrangement, a compensating device and a method in which the sensor technology for detecting the magnetic unidirectional flux is arranged at the core of a transformer such that the interference of any stray flux is limited and the characteristic variable represents the magnetic unidirectional flux as accurately as possible.

This problem is solved by a measuring device for detecting a magnetic unidirectional flux in the core of a transformer, where a sensor, formed from a ferromagnetic sensor core which is enwound by a sensor coil, is arranged in a section of a core limb, where the section is predetermined by the winding width, in a cooling channel or in an annular space which is formed by an outer peripheral surface of the core limb and an inner peripheral surface of the transformer winding, such that a magnetic partial flux is diverted from the core limb and guided over at least one non-ferromagnetic gap.

As a result of this arrangement of the sensor in a cooling channel or in an intermediate space which is formed by an outer peripheral surface of the core limb and an inner peripheral surface of an associated winding of the transformer, the impairment of the measured signal as a result of the magnetic stray flux is comparatively reduced, even in transformers having a five-limb core design. Magnetic screening is not required. The technical evaluation of the sensor signal is comparatively simple.

For the purpose of arranging the magnetic field detector in a cooling channel, where opposing boundary surfaces are situated parallel to each other, a flat sensor core appears beneficial. It can be advantageous for the sensor core to have the shape of an elongated prism, whose longitudinal extension is oriented in the direction of the axis of the core limb. In a preferred embodiment, the prism has a length that is greater than a width of the base of the prism. In an even further preferred embodiment, the length of the prism is more than twice its width. This further assists the arrangement in a cooling channel, which usually extends along a limb axis, or in the annular space between core limb and winding. Here, a cross-section of the sensor core that is adapted to a predetermined shape of a cooling channel or to the spatial ratios in the annular space, where spatial ratios are predetermined by, e.g., the stepped cross-section of the core limb, is apparently beneficial. The base of the prism can be a polygon. If the cross-section of the flow is formed as a rectangle, it is beneficial for the base of the sensor core to be likewise rectangular.

A cooling channel in a core limb usually extends in an axial direction, and therefore a vertically suspended arrangement of the sensor can be advantageous. In a preferred embodiment, the sensor is therefore attached via a suspension device in the shape of a rod or bar.

In order to protect the sensor coil against mechanical influences, it can be advantageous for the sensor coil and sensor core to form an insert in a shell-shaped suspension device. The attachment within such a shell may be effected via a cast substance or an adhesive.

Particularly effective rigidity of the bar-shaped suspension device can be achieved using a carrier that is made of a fiber-reinforced synthetic material. Fiber-reinforced epoxy resin or polyester resin can advantageously be used in this case. It is obviously also possible to use other insulating materials, such as temperature-resistant polyamide.

Concerning manufacturing costs, it can be beneficial for sensor coil and sensor core to form a "hybrid component", made of synthetic material, which can be manufactured via injection molding technology at comparatively little expense.

It is also an object of the invention to provide a compensating device for compensating a magnetic unidirectional flux in the core of a transformer, where a sensor detects the unidirectional flux in at least one core limb of the transformer, and where the sensor has a ferromagnetic sensor core that extends in a longitudinal direction and is enwound by a sensor coil. The sensor is arranged in a section, the section being predetermined by the winding width, in a cooling channel of the core limb or in an annular space that is formed by an outer peripheral surface of the core limb and an inner peripheral surface of the transformer winding, such that a magnetic partial flux is diverted from the core limb and guided over at least one non-ferromagnetic gap.

By virtue of such a compensating device, the unwanted magnetic unidirectional flux in the core can be detected largely without interference, and reduced or compensated effectively, even in the case of high-power transformers. Five-limb core transformers that are already in service can easily be upgraded.

It is also an object of the invention to provide a method for compensating a magnetic unidirectional flux in a magnetic core of an electrical transformer, using a compensating device that is supplied with a signal from a sensor for detecting the unidirectional flux, where the sensor has a ferromagnetic sensor core that is elongated and enwound by a sensor coil, and where the sensor is arranged longitudinally in the direction of the limb axis in a cooling channel or in an annular space that is delimited by the outer peripheral surface of a wound core limb and the inner peripheral surface of the associated transformer winding.

Low-noise operation is therefore possible, even in the case of five-limb core transformers. A further advantage is derived from the reduced thermal load on the electrical winding, this being beneficial to the reliability of a power transformer.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

BRIEF DESCRIPTION OF THE DRAWINGS

In order to further explain the invention, reference is made in the following part of the description to drawings showing further advantageous embodiments, details and developments of the invention with reference to a non-restrictive exemplary embodiment, in which.

DETAILED DESCRIPTION OF THE EXEMPLARY EMBODIMENTS

Figure 1:
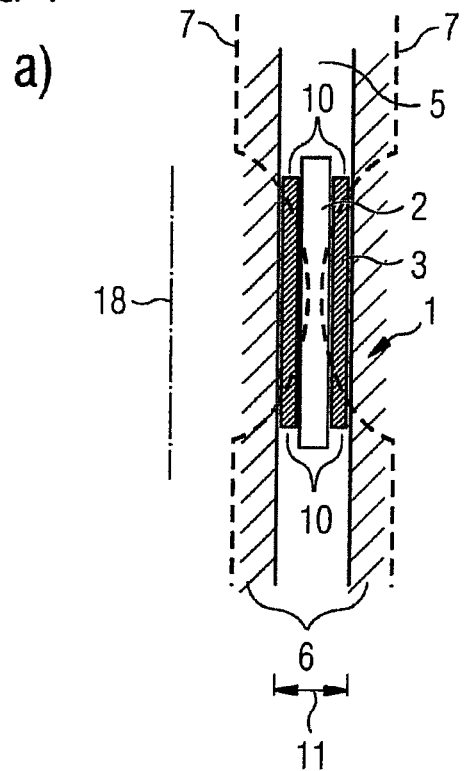
FIG. 1 shows a schematic illustration of a sensor for detecting a magnetic unidirectional flux in the core of a transformer, illustrated in an arrangement in a cooling channel (FIG. 1*a*) or in an annular intermediate space between the lateral surface of the limb and an inner peripheral surface of a winding.
Figure 1:
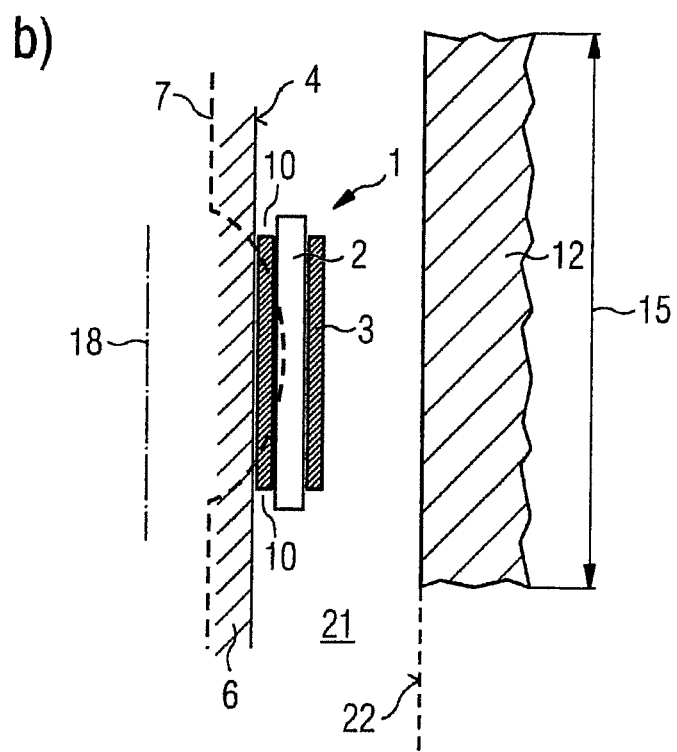

FIG. 1 shows a sensor 1 for detecting a magnetic unidirectional flux in a core limb 6 of a transformer. FIG. 1*a*) shows an arrangement in which the sensor 1 is arranged longitudinally in a cooling channel 5 of a limb 6, in the direction of the limb axis 18. FIG. 1*b*) shows a different arrangement, in which the sensor 1 is arranged externally and adjacent to a peripheral surface 4 of a limb 6. In this arrangement, the sensor 1 is likewise longitudinally oriented in the direction of the limb axis 18.

The sensor 1 essentially consists of a ferromagnetic body, the sensor core 2, which carries a sensor coil 3. In geometric terms, the sensor core 2 is a long, narrow and magnetically soft component of high permeability, which is longitudinally oriented in the direction of the limb axis 18 when installed as intended. Here, the elongated sensor core 2 functions as a magnetic shunt part in both of the arrangements illustrated in FIG. 1. As soon as the magnetically soft material of the core limb 6 reaches saturation, due to the superimposition of unidirectional flux and alternating flux, the sensor core 2 diverts, in the manner of a "magnetic bypass", part of the magnetic flux 7 that is guided in the limb, and guides it back into the core limb 6 via at least one non-ferromagnetic gap 10 (broken line in FIG. 1). In other words, at each half-cycle in which the magnetic material of the limb core 6 reaches saturation due to the magnetic unidirectional flux (caused by a unidirectional flux resulting from a direct current or caused by a "GIC"), the sensor core 2 bridges, in the form of a shunt, that region of the limb 6 that is bridged thereby. In the sensor coil 3, the diverted alternating flux 7 comprising a fraction of the limb main flux induces a sensor voltage 19 which, after signal evaluation, can be used as a measure for the compensation of the magnetic unidirectional flux.

For example, the evaluation may consist in digitizing the sensor voltage 19, filtering out signal portions having doubled network frequency via a band-pass filter, and performing a Fourier transformation on the signal values that have been filtered out. The subsequent compensation of the magnetic unidirectional flux in the core of the transformer may be effected via a power-electronic device, for example, which feeds a compensating current into a compensation winding that is arranged on a limb, where the compensating current counteracts in magnitude and direction the unidirectional flux that must be compensated.

Various magnetically soft materials may be used as a material for the sensor core 2. With regard to its magnetic properties, the sensor core 2 should be selected such that it does not become saturated when guiding the magnetic partial flux that has been diverted from the limb. Magnetic steel sheet, as is normally used for the structure of the transformer, may be used if the non-ferromagnetic gap is configured accordingly.

In the arrangement of FIG. 1*a*), in the cooling channel 5, a magnetic partial flux 7 is diverted from both sides of the cooling channel 5. In the arrangement according to FIG. 1*b*), on the other hand, the diverted partial flux 7 emanates from and goes back into the side face 4 (broken line). In the arrangement of FIG. 1*b*), the flat side of the sensor coil 3 is adjacent to the lateral surface 4 of the core limb 6.

In both arrangements (FIG. 1*a* and FIG. 1*b*), the sensor coil 3 consists of insulated copper wire, and therefore the region physically occupied by the coil 3 in the cooling channel 5 is non-ferromagnetic.

Figure 2:
FIG. 2 shows the sensor of FIG. 1, illustrated in a projection on three planes and in a three-dimensional illustration.
Figure 2:
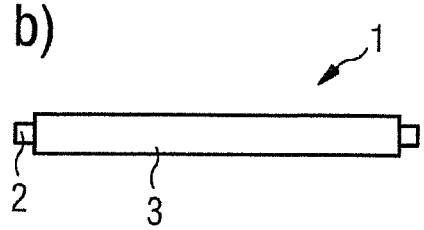
Figure 2:
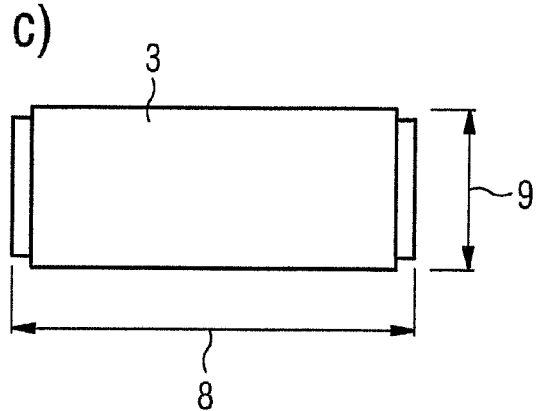
Figure 2:
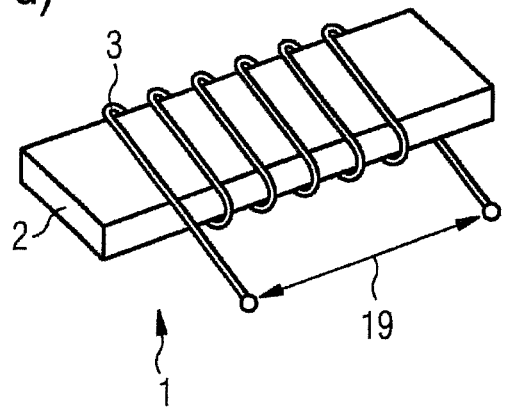

FIG. 2 shows a preferred embodiment of the sensor 1 in a three-plane view. The sensor 1 consists of an elongated sensor core 2 formed as a prism. The base of the prism is a rectangle (FIG. 2*a*). The lateral surface of the prism is enwound by an electrical conductor made of insulated copper wire. In the intended arrangement of the sensor 1 in a cooling channel 5 or in an annular space 21 around a core limb 6, a sensor voltage 19 is induced in the sensor coil 3 by the diverted alternating partial flux 7 as mentioned above. The signal of the sensor voltage 19 is supplied to a compensating device 17 (FIG. 4 and FIG. 5), by which the unwanted unidirectional flux is counteracted.

Figure 3:
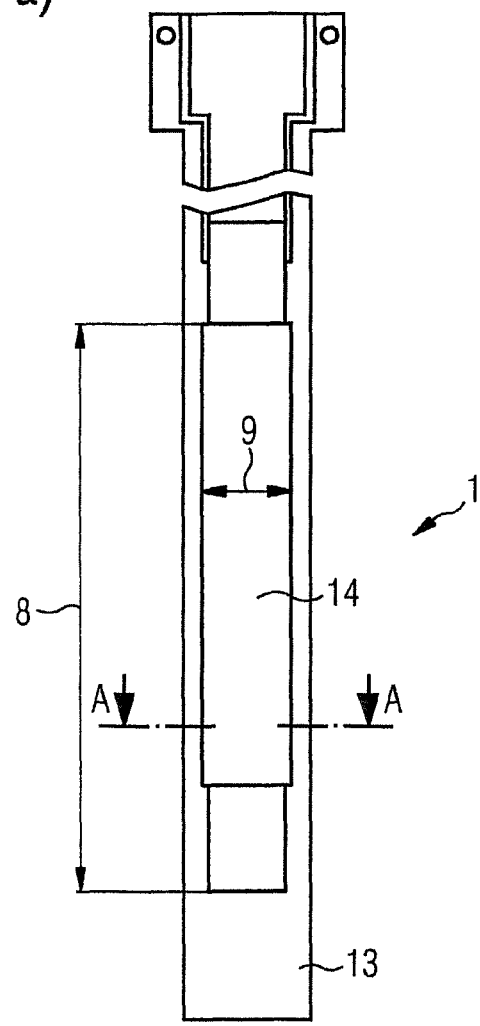
FIG. 3 shows a suspension device in the form of a bar in which the sensor forms an insert in accordance with the invention.
Figure 3:
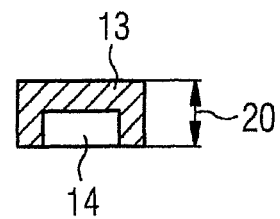

The sensor 1 is arranged so as to be longitudinally suspended in the direction of a limb axis 18. FIG. 3 shows a suspension device 13 for the sensor 1 in a cooling channel 5 or in an intermediate space 21 that is formed by the inner peripheral surface of a transformer winding and an outer peripheral surface 4 of a core limb 6. The suspension device 13 essentially consists of a carrier formed as a bar or a rod, and a head part. The head part prevents the detector from unintentionally slipping into the cooling channel during installation. The carrier is considerably longer than it is wide in its dimensions. The axial length of the carrier or the sensor core 2 may differ depending on the size of a power transformer. Preferably, the length 8 of the sensor core 2 is more than twice its width. The length 8 is dimensioned such that the number of attached windings of the sensor coil 3 provides a sensor signal 19 that is readily evaluated. This is achieved using a length 18 of 1 m or more, for example, the width 9 of the sensor 1 being a few centimeters, for example. Using these dimensions for the magnetic field sensor, its arrangement in a cooling channel 5 has little adverse effect on the cooling efficiency.

The carrier of the suspension device 13 is made from an electrical insulator, e.g., a temperature-resistant polymer material that is compatible with the cooling medium of the transformer. In its longitudinal extension, the carrier has a shell-like recess 14 (section A-A in FIG. 3*b*) in which the elongated sensor core 2 and the sensor coil 3 thereon are embedded. By virtue of this embedding, the sensor coil 3 is very effectively protected against mechanical interference. With regard to manufacturing, construction as a hybrid component is beneficial, where the sensor core and sensor coil are inserted into an injection molding tool with corresponding distance holders and encapsulated by a synthetic material, e.g., such as fiber-reinforced epoxy resin.

In the case of a vertical arrangement in a cooling channel 5, the thickness 20 of the carrier corresponds approximately to the cooling channel width 11. The ferromagnetic gap 10 between sensor core and limb 6 is established thereby. This applies correspondingly to a corresponding location for an arrangement in the annular space 21 between the winding and side face of the limb 6. In order to attach the suspension device 13 in the housing of a transformer, holes for screws are provided at the head part.

Figure 4:
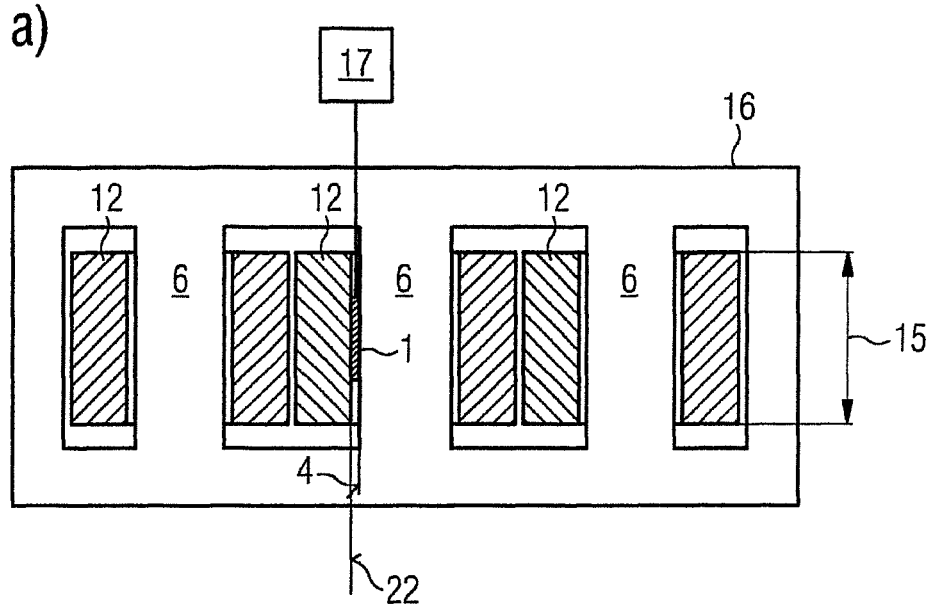
FIG. 4 shows an arrangement of the sensor on a side face of a limb core of a symmetrical five-limb core rotary transformer in accordance with the invention.
Figure 4:
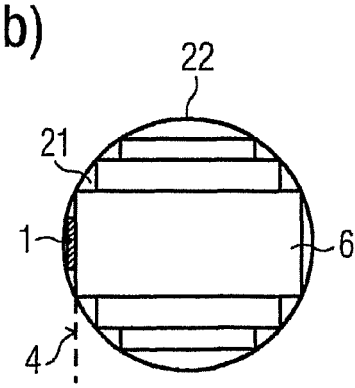
Figure 5:
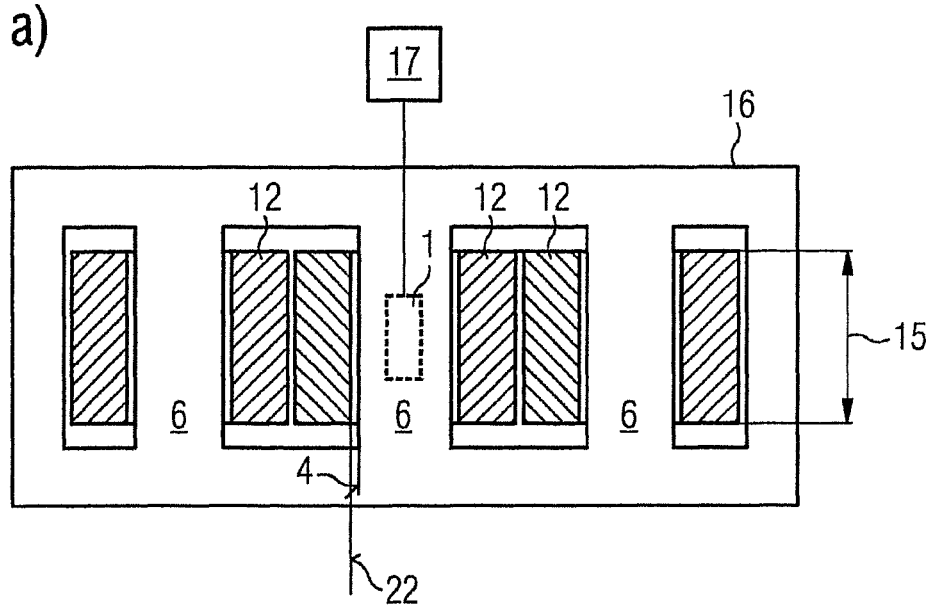
FIG. 5 shows an arrangement of the sensor in a cooling channel of a limb core of a symmetrical five-limb core rotary transformer in accordance with the invention.
Figure 5:
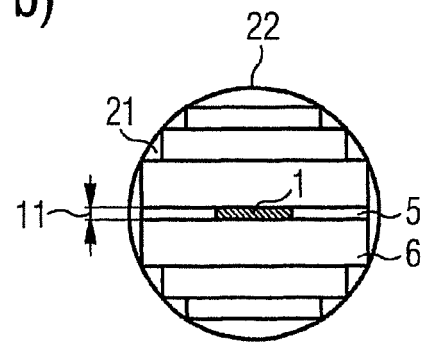

FIG. 4 and FIG. 5 illustrate the arrangement of the sensor 1 in a symmetrical five-limb core 16 of a three-phase transformer. As stated above, the arrangement of the sensor 1 is suspended (FIG. 4*a*), either in an annular space 21 between an inner peripheral surface 22 of an internal winding 12 of the transformer (e.g., low-voltage winding) and an outer peripheral surface 4 of the stepped core limb 6 (FIG. 4*b*), or in a cooling channel 5 of a core limb 6 (FIG. 5*a* and FIG. 5*b*). Viewed in the direction of the limb axis 18, the sensor 1 is situated in both arrangements so as to be approximately symmetrical in relation to the center of the winding width 15.

As indicated in the drawings for FIG. 4 and FIG. 5, the sensor signal 19 is supplied to a compensating device 17 that compensates the unwanted magnetic unidirectional flux in the core 16 of the transformer 1, (not shown in greater detail in the drawings).

Although the invention is illustrated and described in detail with reference to preferred exemplary embodiments, the invention is not restricted by the examples disclosed herein. Other variations may be derived therefrom by a person skilled in the art without thereby departing from the scope of the invention.

For example, the sensor core 1 is in no way restricted to the drawn shape of an elongated prism having a rectangular base, and can instead have a cross-section of a different configuration depending on the geometric shape of the cooling channel or the intermediate space available between core limb and inner peripheral surface of the transformer winding.

The length of the sensor core may also be longer than that illustrated, possibly as long as the whole winding width, for example.

In an economical embodiment, magnetic steel sheet as normally used for the core of the transformer can also be used for the sensor core. The sensor core can also consist of a piece of magnetic steel sheet or a plurality of laminations. It is obviously also possible to use other high-permeability materials.

The invention allows a magnetic unidirectional flux to be detected reliably and compensated efficiently using a suitable compensating device, even in the case of transformers having a nominal power of many MVA, where the transformers are normally configured in a five-limb core format.

The heating is reduced as a result of the effective compensation of the unidirectional flux, thereby increasing the service life of the insulating materials of the winding.

It is considered a further essential advantage that operating noises of a power transformer are reduced effectively.

The manufacture of the sensor is simple and satisfies the requirements for reliability and durability demanded by power transformers. The manufacturing costs are low.

The measuring arrangement can also be used for monitoring.

A further advantage consists in the simple upgrading, conversion and modernization of existing power transformers.

Figure 6:
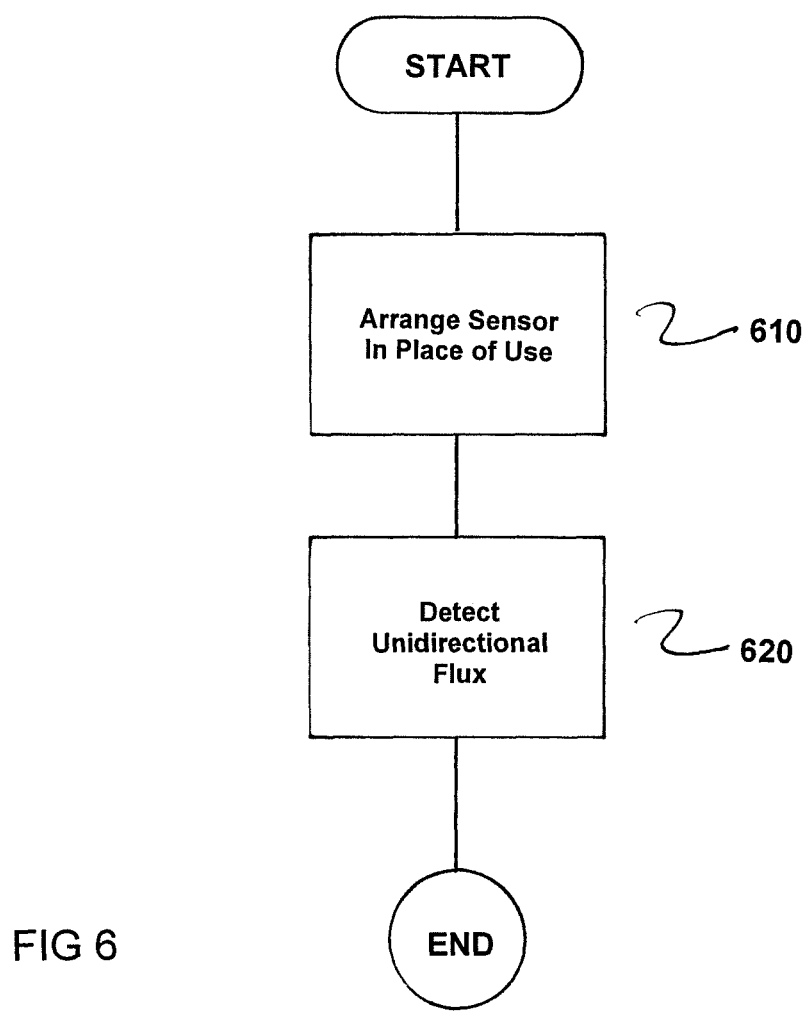
FIG. 6 is a flowchart of the method in accordance with the invention.

FIG. 6 is a flowchart of a method for compensating a magnetic unidirectional flux in a magnetic core (16) of an electrical transformer. The method comprises detecting, via a compensating device (17) which is supplied with a sensor signal (19) from a sensor (1), the unidirectional flux, the sensor (1) including a ferromagnetic sensor core (2) which is elongated and enwound by a sensor coil (3), as indicated in step 610. Next, the sensor (1) is longitudinally arranged in its intended place of use in a direction of a limb axis (18) in one of (i) a cooling channel (5) and (ii) an intermediate space between an inner peripheral surface of a transformer winding and a side face (4) of a core limb (6), as indicated in step 620.

While there have been shown, described and pointed out fundamental novel features of the invention as applied to a preferred embodiment thereof, it will be understood that various omissions and substitutions and changes in the form and details of the methods described and the devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

The invention claimed is:

1. A measuring arrangement for detecting a magnetic unidirectional flux in the core of a transformer, comprising:
   a rod-shaped core limb having a winding; and
   a sensor formed from a ferromagnetic sensor core enwound by a sensor coil, said sensor being arranged along a section of the rod-shaped core limb and adjacent to the winding of the rod-shaped core limb, said section being predetermined by a winding width of the winding of the rod-shaped core limb, said sensor being also arranged in one of (i) a cooling channel and adjacent to the winding of the rod-shaped core limb and (ii) an annular space formed by an outer peripheral surface of the rod-shaped core limb and an inner peripheral surface of the winding of the rod-shaped core limb, such that a magnetic flux is partially diverted from the rod-shaped core limb and guided over at least one non-ferromagnetic gap formed between the outer peripheral surface of the rod-shaped core limb and the inner peripheral surface of the winding of the rod-shaped core limb;
   wherein the sensor core is prism shaped and extends in a longitudinal direction which is oriented in a direction of a limb axis during use of the sensor;
   wherein a length of the sensor core is more than twice its width;
   wherein the ferromagnetic sensor core and the sensor coil are formed together as an insert in a bar-shaped suspension device;
   wherein the bar-shaped suspension device includes a carrier comprising a fiber-reinforced synthetic material; and
   wherein the carrier includes a longitudinally extending shell-like recess for receiving the sensor.

2. The measuring arrangement as claimed in claim 1, wherein a base of the prism is rectangular.

3. The measuring arrangement as claimed in claim 1, wherein the sensor and the carrier form a hybrid component comprising the fiber-reinforced synthetic material manufactured via injection molding technology.

4. A compensating device for compensating a magnetic unidirectional flux in an electrical transformer, comprising:
   a sensor which detects the unidirectional flux in at least one rod-shaped core limb having a winding;
   wherein:
   a) the sensor is formed from a ferromagnetic sensor core enwound by a sensor coil;
   wherein:
   b) the sensor is arranged along a section of the rod-shaped core limb and adjacent to the winding of the rod-shaped core limb, said section being predetermined by a winding width of the winding of the rod-shaped core limb, said sensor being also arranged in one of (i) a cooling channel of the rod-shaped core limb and adjacent to the winding of the rod-shaped core limb and (ii) an annular space formed by an outer peripheral surface of the rod-shaped core limb and an inner peripheral surface of the winding of the rod shaped core limb, such that a magnetic flux is partially diverted from the rod-shaped core limb and guided over at least one non-ferromagnetic gap formed between the outer peripheral surface of the rod-shaped core limb and the inner peripheral surface of the winding of the rod-shaped core limb;
   wherein:
   c) the sensor core is prism shaped and extends in a longitudinal direction which is oriented in a direction of a limb axis during use of the sensor;
   wherein:
   d) a length of the sensor core is more than twice its width;
   wherein:
   e) the ferromagnetic sensor core and the sensor coil are formed together as an insert in a bar-shaped suspension device;
   wherein:
   f) the bar-shaped suspension device includes a carrier comprising a fiber-reinforced synthetic material; and
   wherein:
   g) the carrier includes a longitudinally extending shell-like recess for receiving the sensor.

5. A method for compensating a magnetic unidirectional flux in a magnetic core of an electrical transformer, comprising:
   detecting, via a compensating device which is supplied with a sensor signal from a sensor, the unidirectional flux, the sensor being formed from a ferromagnetic sensor core enwound by a sensor coil; and
   arranging the sensor along a section of a rod-shaped core limb having a winding and adjacent to the winding of the rod-shaped core limb in one of (i) a cooling channel and (ii) an intermediate space between an inner peripheral surface of the winding and a side face of the rod-shaped core limb, such that a magnetic flux is partially diverted from the rod-shaped core limb and guided over at least one non-ferromagnetic gap formed between an outer peripheral surface of the rod-shaped core limb and an inner peripheral surface of the winding of the rod-shaped core limb, said section being predetermined by a winding width of the winding of the rod-shaped core limb
   wherein the sensor core is prism shaped and extends in a longitudinal direction which is oriented in a direction of a limb axis during use of the sensor;
   wherein a length of the sensor core is more than twice its width;
   wherein the ferromagnetic sensor core and the sensor coil are formed together as an insert in a bar-shaped suspension device;

wherein the bar-shaped suspension device includes a carrier comprising a fiber-reinforced synthetic material; and wherein the carrier includes a longitudinally extending shell-like recess for receiving the sensor.

* * * * *